(12) United States Patent
Harshfield

(10) Patent No.: US 6,440,795 B1
(45) Date of Patent: Aug. 27, 2002

(54) HEMISPHERICAL GRAINED SILICON ON CONDUCTIVE NITRIDE

(75) Inventor: Steven T. Harshfield, Emmett, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/705,010

(22) Filed: Nov. 2, 2000

Related U.S. Application Data

(60) Continuation of application No. 09/244,710, filed on Feb. 4, 1999, now Pat. No. 6,187,631, which is a continuation of application No. 08/781,510, filed on Jan. 8, 1997, now Pat. No. 5,899,725, which is a division of application No. 08/558,164, filed on Nov. 15, 1995, now Pat. No. 5,612,558.

(51) Int. Cl.[7] .......................................... H01L 21/8242
(52) U.S. Cl. ....................... 438/255; 438/253; 438/396; 438/398
(58) Field of Search ................................ 438/253, 255, 438/396, 398, 665, 964

(56) References Cited

U.S. PATENT DOCUMENTS

| | | | |
|---|---|---|---|
| 5,037,773 A | 8/1991 | Lee et al. | 438/255 |
| 5,043,780 A | 8/1991 | Fazan et al. | 257/306 |
| 5,102,832 A | 4/1992 | Tuttle | 438/398 |

(List continued on next page.)

FOREIGN PATENT DOCUMENTS

TW  419819 A  * 1/2001

OTHER PUBLICATIONS

Watanabe, et al., "An Advanced Technique for Fabricating Hemispherical–Grained (HSG) Silicon Storage Electrodes," IEEE Transactions on Electron Devices, vol. 42, No. 2, Feb. 1995, pp. 295–300.

Watanabe, et al., "Hemispherical Grained Si Formation on In–Situ Phosphorus Doped Amorphous–Si Electrode for 256Mb DRAM's Capacitor," IEEE Transactions on Electron Devices, vol. 42, No. 7, Jul. 1995, pp. 1247–1254.

Sakai, et al., "Novel Seeding Method for the Growth of Polycrystalline Si Films With Hemispherical Grains," Appl. Phys. Lett, vol. 61, No. 2, Jul. 13, 1992, pp. 159–161.

Primary Examiner—Carl Whitehead, Jr.
Assistant Examiner—Toniae M. Thomas
(74) Attorney, Agent, or Firm—Knobbe, Martens, Olson & Bear LLP

(57) ABSTRACT

Disclosed is a method of growing hemispherical grained silicon (HSG silicon) over a conductive seed layer. In a preferred embodiment, a contact window is etched in an insulating layer to expose a circuit node, such as an active area of a substrate or a contact plug leading to an active area A layer of titanium nitride is deposited over the insulating layer and into the contact window. The titanium nitride (TiN) serves as the seed layer for HSG silicon growth to follow. Polysilicon is deposited and grows around nucleation sites on the TiN surface. The TiN provides both electrical and mechanical support for the HSG silicon. Additionally, as TiN is an effective diffusion barrier, the HSG silicon may be heavily doped without undue risk of dopant diffusion to the active area.

15 Claims, 5 Drawing Sheets

U.S. PATENT DOCUMENTS

| | | | |
|---|---|---|---|
| 5,112,773 A | 5/1992 | Tuttle | 438/398 |
| 5,130,885 A | 7/1992 | Fazan et al. | 361/313 |
| 5,138,411 A | 8/1992 | Sandhu | 257/296 |
| 5,139,974 A | 8/1992 | Sandhu et al. | 438/665 |
| 5,182,232 A | 1/1993 | Chhabra | 438/398 |
| 5,191,509 A | 3/1993 | Wen | 361/311 |
| 5,266,514 A | 11/1993 | Tuan et al. | 438/398 |
| 5,278,091 A | 1/1994 | Fazan et al. | 438/398 |
| 5,318,920 A | 6/1994 | Hayashide | 438/398 |
| 5,320,880 A | 6/1994 | Sandhu et al. | 427/578 |
| 5,340,765 A | 8/1994 | Dennison et al. | 438/398 |
| 5,366,917 A | 11/1994 | Watanabe et al. | 438/398 |
| 5,372,962 A | 12/1994 | Hirota | 438/398 |
| 5,385,863 A | 1/1995 | Tatsumi et al. | 438/398 |
| 5,405,801 A | 4/1995 | Han et al. | 438/386 |
| 5,407,534 A | 4/1995 | Thakur | 438/398 |
| 5,418,180 A | 5/1995 | Brown | 438/398 |
| 5,444,013 A | 8/1995 | Akram et al. | 438/398 |
| 5,458,697 A | 10/1995 | Ishigami et al. | 438/592 |
| 5,489,544 A | 2/1996 | Rajeevakumar | 438/244 |
| 5,561,307 A | 10/1996 | Mihara et al. | 257/295 |
| 5,563,090 A | 10/1996 | Lee et al. | 438/398 |
| 5,569,614 A | 10/1996 | Kataoka | 438/571 |
| RE35,420 E | 1/1997 | Cathey et al. | 438/398 |
| 5,608,249 A * | 3/1997 | Gonzalez | 257/306 |
| 5,622,888 A | 4/1997 | Sekine et al. | 438/398 |
| 5,696,017 A | 12/1997 | Ueno | 438/253 |
| 5,741,734 A | 4/1998 | Lee | 438/255 |
| 5,760,434 A | 6/1998 | Zahurak et al. | 257/309 |
| 5,763,286 A | 6/1998 | Figura et al. | 438/255 |
| 5,817,555 A | 10/1998 | Cho | 438/255 |
| 5,866,455 A | 2/1999 | Wu | 438/255 |
| 5,956,587 A | 9/1999 | Chen et al. | 438/255 |
| 5,981,334 A | 11/1999 | Chien et al. | 438/253 |
| 6,114,198 A * | 9/2000 | Huang et al. | 438/239 |
| 6,274,428 B1 * | 8/2001 | Wu | 438/255 |
| 6,329,264 B1 * | 12/2001 | Wu | 438/398 |

* cited by examiner

HEMISPHERICAL GRAINED SILICON ON CONDUCTIVE NITRIDE

This application is a continuation of U.S. application Ser. No. 09/244,710, filed Feb. 4, 1999, now U.S. Pat. No. 6,187,631 B1, which is a continuation of U.S. application Ser. No. 08/781,510, filed Jan. 8, 1997 and issued May 4, 1999 as U.S. Pat. No. 5,899,725, which is a divisional of U.S. application Ser. No. 08/558,164, filed Nov. 15, 1995 and issued Mar. 18, 1997 as U.S. Pat. No. 5,612,558.

BACKGROUND OF THE INVENTION

The present invention relates to the growth of hemispherical grained silicon for creating a texturized polycrystalline silicon layer, and more particularly to the use of seed layers from which silicon grains are grown for integrated circuit application.

Recent advances in the miniaturization of integrated circuits have led to smaller chip areas available for devices. High density dynamic random access memory chips (DRAMs), for example, leave little room for the storage node of a memory cell. Yet, the storage node (capacitor) must be able to store a certain minimum charge, determined by design and operational parameters, to ensure reliable operation of the memory cell. It is thus increasingly important that capacitors achieve a high stored charge per unit area.

Traditionally, capacitors integrated into memory cells have been patterned after the parallel plate capacitor. An interlayer dielectric material is deposited between the deposition of two conductive layers, which form the capacitor plates. Several techniques have been developed to increase the total charge capacity of the cell capacitor without significantly affecting the chip area occupied by the cell. Some include the use of new high dielectric materials between the plates. Other techniques concentrate on increasing the effective surface area of the plates by creating folding structures, such as trench or stacked capacitors. Such structures better utilize the available chip area by creating three dimensional shapes to which the conductive plates and interlayer dielectric conform.

One commonly used method of increasing cell capacitance involves further increasing the surface area of the capacitor plates by providing a roughened or texturized plate surface. Roughened polycrystalline silicon (polysilicon, or simply poly) in the form of hemispherical grained silicon (HSG silicon, or HSG polysilicon), for example, has been utilized for the bottom plate of the capacitor. This further increases the effective area of the bottom plate, thus increasing the capacitance of the storage node.

FIG. 1 illustrates the result of a prior art HSG polysilicon forming process in connection with a DRAM cell 10. A pair of word lines 12 are shown isolated by a plurality of vertical dielectric spacers 13, word line insulating caps 14 and an insulating layer 15. A contact window 16 is opened through the insulating layer 15 to expose an active area 17 between the word lines 12. The word lines 12 each overlie either a relatively thick field oxide 18 or a much thinner gate oxide 19. A poly or amorphous silicon layer 20 is then deposited over the insulating layer 15 and through the window 16, contacting the active area 17. In order to provide reasonable conductivity, the silicon layer 20 is lightly doped with n-type dopants.

An extremely thin layer of native oxide 24 is allowed to grow over the silicon layer 20, serving as the seed layer for the HSG polysilicon growth to follow. HSG polysilicon may then be deposited by low pressure chemical vapor deposition (LPCVD), among other techniques, and silicon grains 26 grow about nucleation sites provided by the native oxide 24. A layer of HSG polysilicon 30, which forms the bottom plate of the storage node, results over the native oxide 24. Although not shown in FIG. 1, subsequent process steps include doping the HSG polysilicon 30, depositing a conformal dielectric layer over the bottom plate HSG polysilicon 30, and depositing a conformal polysilicon layer to form the top plate of the storage node.

Subsequent heat cycles and other mechanisms must be implemented to break up the native oxide 24 so that a conductive path is formed between the HSG silicon 30 and poly 20 and the underlying active area 17. Even after break-up, oxide ($SiO_2$) 24 remains and contributes to the sheet resistance of the bottom plate, lowering capacitance of the memory cell. Moreover, the heat cycles required to break up the native oxide 24 exacerbate unwanted dopant diffusion.

Furthermore, the HSG silicon 30 should be heavily doped to decrease the charge depletion width in the bottom plate, thus increasing capacitance. However, heavily doping the HSG silicon 30 also allows diffusion of the dopants through the silicon layer 20 to the underlying active area 17. For example, phosphorus from solid source $P_2O_5$, a commonly employed dopant, diffuses easily through silicon during high temperature anneal steps. The diffused dopants interfere with junction operation and cause current leakage, which reduces charge storage of the memory cell. Although implanted decants such as arsenic ions diffuse less easily, they are not conformally deposited, they are more expensive, and they do not eliminate diffusion. Reverse diffusion, or "out diffusion" from the active area may similarly occur, changing the dopant profile of the active area and the transistor characteristics.

To provide structural support and adequately low sheet resistance, the silicon layer 20 should be relatively thick (on the order of 500 Å). However, this thick silicon layer 20 occupies a substantial volume of the memory cell, which may otherwise have been available for three dimensional cell structures capable of increasing plate surface area Alternative methods of HSG silicon formation are also known, such as those disclosed in U.S. Pat. No. 5,320,880, issued to Sandhu et al.; U.S. Pat. No. 5,202,278, issued to Mathews et al.; and U.S. Pat. No. 5,112,773, issued to Tuttle. Since HSG polysilicon formed by these methods must be doped and the underlying silicon allows excessive diffusion, these alternative methods entail similar problems with the diffusion of dopants.

SUMMARY OF THE INVENTION

A method is disclosed for growing roughened polysilicon over a conductive seed layer. After the conductive layer is formed, polysilicon is deposited over the seed layer, preferentially nucleating around nucleation sites on the surface of the seed layer. Hemispherical grained silicon result from this process.

The invention may be embodied in a DRAM cell. In the preferred embodiment, a contact window is etched through an insulating layer to expose a circuit node. A titanium nitride layer is deposited over the insulating layer and through the contact window. Thereafter, a layer of hemispherical grained silicon nucleates and grows on the conductive layer.

DETAILED DESCRIPTION OF THE PREFERRED EMBODIMENT

Although the present description focuses on the context of a DRAM cell, it will be understood that the present invention may have utility in many applications where a rough or high surface area conductive layer is desired. Such applications include capacitors of all sorts, and especially capacitors integrated into electronic circuitry. The invention has particularly utility where the structure should also advantageously serve as a diffusion barrier.

Figure 2:
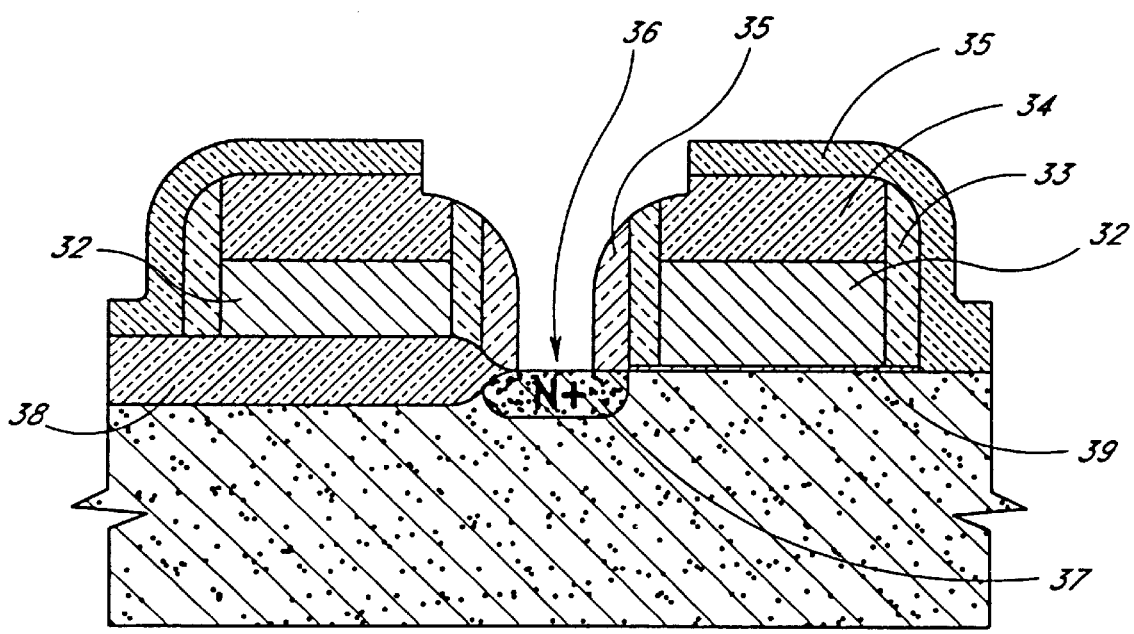
FIG. 2 is a partial schematic sectional view of a memory cell in accordance with a preferred embodiment of the present invention, illustrating a stage in the fabrication process after a contact window has been opened to expose an active area.

FIG. 2 illustrates a starting point for the preferred embodiment of the present invention. As with the prior art DRAM memory cell formation described in the "Background" section above, a pair of word lines 32 have been formed and isolated by a plurality of vertical dielectric spacers 33, word line insulating caps 34 and a dielectric insulating layer 35. A contact window 36 has been etched through the insulating layer 35 by contact etch methods known in this art. The insulating layer 35 may comprise any of a number of dielectric materials, such as silicon nitrides, silicon oxides or combinations of the same (for example, oxide-nitride-oxide layers, or ONO). In the preferred embodiment, the insulating layer 35 comprises oxide deposited from tetraethylorthosilicate, or TEOS. The vertical spacers 33 and insulating cap 34 may be comprised of similar materials, preferably silicon nitride.

The contact etch process etches the insulating layer 35, through a mask, selectively against a circuit node 37, and at the same time the etch should not cause excessive damage to the preferred silicon nitride spacers 33 and insulating caps 34. The circuit node 37 which stops the etch may comprise a conductive plug, like that illustrated in U.S. Pat. No. 5,340,765. In the preferred embodiment, however, it comprises an active area 37 of an underlying silicon substrate between a field oxide 38 and a thin gate oxide 39, so that the etch preferably stops when the active area 37 is exposed. The active area 37 may be the source or drain of a MOS-type device which is to be integrated into the DRAM. The wafer should be etched enough time to clear the insulating layer 35 through the mask down to the active area 37, as will be understood by those having skill in the art. In fact, an overetch (about 25%) should be performed to ensure that the active area 37 is cleaned of all insulating layer 35 at the window 36.

A conductive, amorphous layer 50 (FIG. 3), preferably a refractory metal nitride, is thereafter deposited conformally into the contact window 36 and over the insulating layer 35. Titanium nitride or tungsten nitride, for example, may be deposited for this step. The preferred embodiment utilizes a layer of titanium nitride (TiN) 50. It will be understood by those of skill in this art that the TiN layer 50 need not directly contact the active area 37. Rather, intermediate conductive layers, such as tungsten silicide, titanium silicide, or polysilicon, may electrically bridge the active area 37 and the TiN layer 50.

Any known TiN deposition technique may be used, although preferred processes should have good step coverage into the contact window 36 and produce a thin TiN layer 50. Low pressure chemical vapor deposition (LPCVD) processes, for example, produce excellent conformity and strictly control thickness of deposited layers. The LPCVD of the preferred embodiment is a metal organic CVD (MOCVD) wherein the metal organic precursor most preferably comprises tetrakisdimethylamidotitanium (TDMAT) while the carrier gas is nitrogen ($N_2$). The TiN deposition is preferably conducted in an Applied Materials TiN CVD chamber at between about 300° C. and 500° C., more preferably between 400° C. and 450° C., and most preferably about 425° C., while the chamber pressure is preferably maintained between about 0.1 Torr and 2.0 Torr and most preferably at about 0.5 Torr. TiN deposited by this method may also include small amounts of oxygen and carbon due organic content of the precursor. A similar MOCVD TiN process is disclosed in the copending U.S. patent application of Sandhu et al., entitled "Method Of Forming Capacitors And Capacitor Construction," Ser. No. 08/444,852, filed May 19, 1995, assigned to the assignee of the present invention, the disclosure of which is hereby incorporated by reference.

Alternative methods of TiN formation include CVD with $TiCl_4$ as the titanium source and $NH_3$ as the nitrogen source, or CVD Ti deposition followed by a thermal nitrogen furnace anneal for between about 10 to 30 minutes. The latter step is well known in the art, and at least partially converts deposited titanium to TiN by combining the metal with ambient nitrogen.

The TiN layer 50 is preferably deposited to a thickness between about 50 Å and 500 Å, more preferably between 100 Å and 300 Å, and most preferably about 150 Å. This TiN layer 50, which will serve as the seed layer for silicon grain growth, may be thinner than prior art poly or amorphous silicon layers while providing comparable mechanical support and low resistance. Whereas polysilicon layers thinner than about 500 Å risk high sheet resistance, which would detrimentally increase refresh time for the memory cell, the TiN layer 50 may be as thin as 100 Å or less while still providing acceptable conductivity. Thicknesses greater than 300 Å, on the other hand, may lead to more difficult etching of the TiN 50 when the capacitor plate is to be patterned. Furthermore, due to the three-dimensional configurations of current memory cell capacitors, thicker support layers for bottom plate HSG silicon reduce the surface area of the bottom plate. It will be understood that, within the bounds of these limitations, the optimal thickness will differ for different refractory metal nitrides.

Regardless of the method of deposition, an optional post-deposition thermal anneal may be performed on the TiN layer 50. The thermal anneal may take the form of a rapid thermal anneal (RTP) for about 20 to 30 seconds, which serves to stabilize the TiN layer 50 by combining any residual reactants within the deposited film. The RTP preferably takes place in a predominantly nitrogen ($N_2$) environment. Alternatively, a longer nitrogen furnace anneal may also be performed (10 to 30 minutes) for batches of wafers. Either thermal anneal should be conducted at temperatures between about 600° C. and 900° C., more preferably between about 700° C. and 800° C., and most preferably at about 750° C.

Another optional post-deposition treatment may be performed on TiN formed by the preferred MOCVD process, prior to exposing the TiN layer 50 to air. A hydrogen plasma treatment reacts hydrogen with undesired carbon and/or oxygen left in the film by the decomposition of the organic precursor. At the same time, nitrogen plasma may be included in the treatment, whereby nitrogen atoms may replace carbon atoms, thus replacing TiC (or more complex compounds) with TiN. This plasma treatment may be intermittently pulsed with thin titanium nitride metal organic depositions within the same reactor. The plasma anneal reduction of organic content in the film, in combination with the more complete conversion of the Ti into TiN, results in a significantly lower resistance for the TiN layer. Lower resistance advantageously decreases the overall memory cell resistance and increases the response time of the cell. At the same time, a more purely TiN layer acts as a better diffusion barrier. The plasma anneal is described in the pending U.S. Patent Application of Sandhu, entitled "Method Of Reducing Carbon Incorporation Into Films Produced By Chemical Vapor Deposition Involving Organic Precursor Compounds," Ser. No. 08/336,260, filed Nov. 8, 1994, the disclosure of which is hereby incorporated by reference.

It should be understood that, for some capacitor configurations, the etch and TiN deposition steps of the present invention may be more complicated than described for the preferred embodiment, including multiple sub-steps. For example, U.S. Pat. No. 5,340,765, issued to Dennison et al. discloses a container capacitor, and U.S. Pat. No. 5,340,763, issued to Dennison, discloses a multi-pin stacked structure for the memory cell storage node. These patents are incorporated by reference. The present invention may be implemented in conjunction with such structures by replacing the polysilicon or amorphous silicon on which the HSG silicon is formed, with a TiN layer and continuing fabrication in accordance with the present disclosure.

Figure 1:
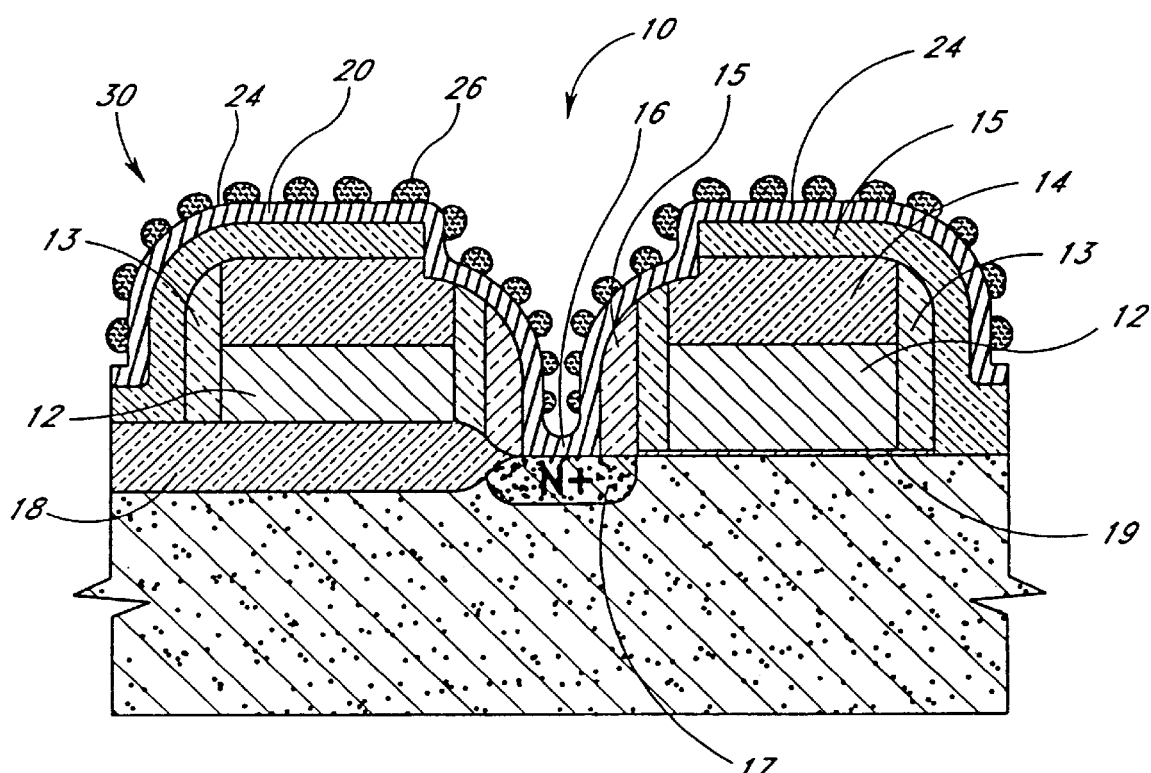
FIG. 1 is a partial schematic sectional view of a prior art memory cell employing hemispherical grained silicon for a bottom capacitor plate.
Figure 3:
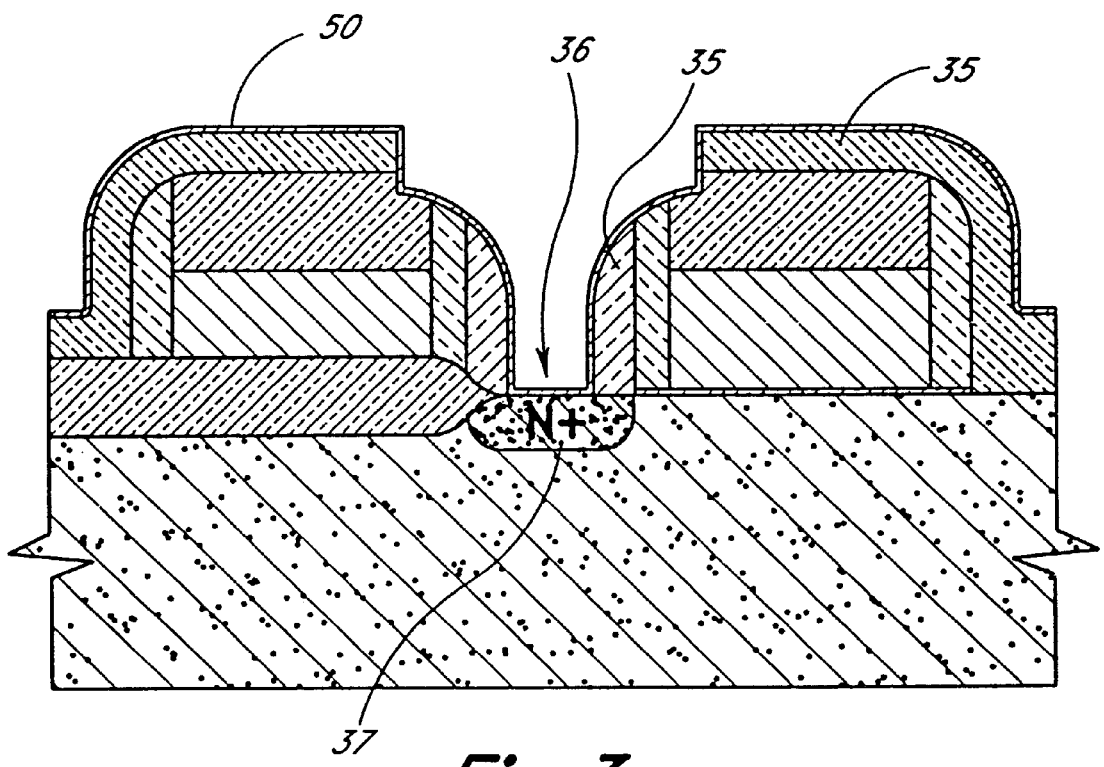
FIG. 3 illustrates the memory cell of FIG. 2 following deposition of a titanium nitride layer.
Figure 4:
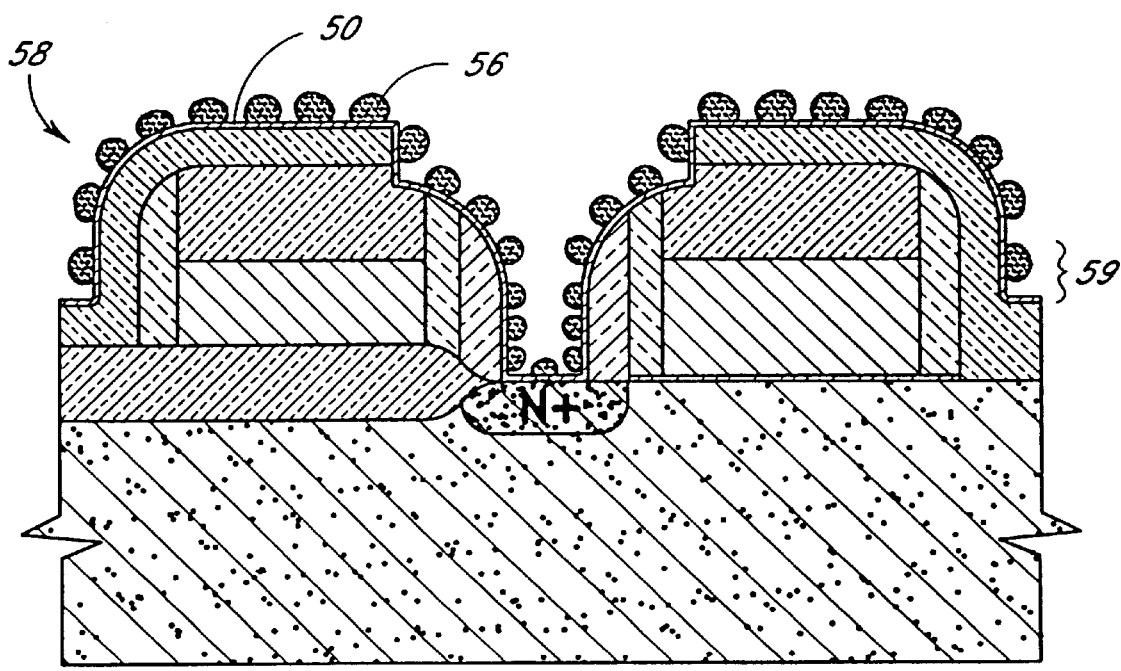
FIG. 4 illustrates the memory cell of FIG. 3, following a hemispherical grained silicon growth step.

After TiN deposition and any anneal steps, as shown in FIG. 3, polysilicon may be deposited over the TiN layer 50 by chemical vapor deposition techniques known in this art. In fact, the polysilicon deposition which forms the hemispherical grained silicon over the TiN layer 50 may be the same as the prior art methods used to form HSG silicon over native oxide 24 (FIG. 1). U.S. Pat. No. 5,102,832, issued to Tuttle, for example, discloses preferential HSG silicon formation at nucleation sites such as oxide particles. This disclosure is hereby incorporated by reference. Typical prior art polysilicon deposition for this purpose has been conducted within a temperature range of 500° C. to 650° C. and a pressure range of 10 mTorr to 300 mTorr.

With the present invention, nucleation sites are provided by the TiN layer 50, rather than silicon oxide or other foreign particles. Deposited HSG polysilicon nucleates on the TiN surface, or in the gas phase, to form a plurality of polysilicon nodules over the TiN layer 50. Continued polysilicon deposition causes these nodules to grow to form a plurality of grains 56. Together, these grains 56 form a texturized polysilicon surface 58, or HSG silicon 58, which, together with the underlying TiN layer 50, serves as a bottom plate 59 for the cell storage node of the preferred embodiment. Although any prior art HSG polysilicon CVD deposition may be incorporated in the present invention, the preferred temperature range is between about 500° C. and 650° C., most preferably between about 540° C. and 560° C., and the preferred pressure range is between about 10 mTorr and 300 mTorr, and most preferably about 100 mTorr.

From this point, the memory cell storage node may be completed using conventional fabrication techniques for DRAMs. Although not shown in the drawings, these techniques include depositing an interlayer dielectric conformally over the bottom plate 59. This capacitor dielectric may be formed both over HSG polysilicon 58 and over any TiN 50 left exposed between silicon grains 56. A conductive top plate would then be formed over the interlayer dielectric, as known in the art.

Figure 5:
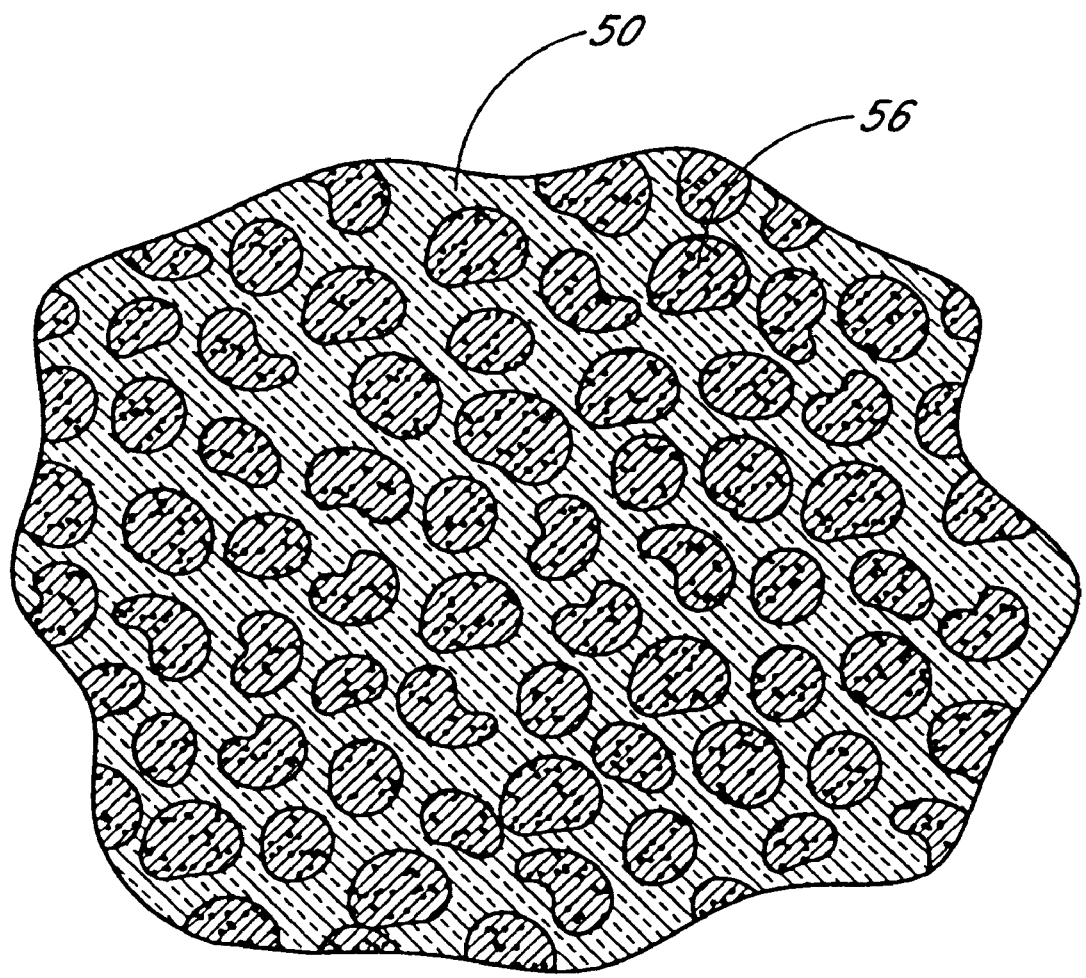
FIG. 5 is a top down view of hemispherical grained silicon grown over a titanium nitride layer, in accordance with a preferred embodiment of the present invention.

The HSG silicon growth over TiN has been reduced to practice. HSG polysilicon was grown during CVD polysilicon deposition at temperatures between about 540° C. and 560° C. and a pressure of about 100 mTorr. As with many common polysilicon depositions, silane ($SiH_4$) is decomposed to provide silicon. It was observed that the resultant polysilicon grain size and separation is comparable to that achieved using prior art native oxide as the seed layer. FIG. 5, a top down view of the HSG silicon 56 over the TiN layer 50, illustrates this typical separation.

Thus, HSG silicon can be formed directly on the TiN seed layer 50. As with prior art seed layers, the TiN layer 50 provides mechanical support for the HSG silicon layer 58. At the same time, since. TiN is conductive, the TiN layer 50 also provides electrical connection between individual grains 56 and between the HSG polysilicon layer 58 and the underlying active area 37. There is no need to break up any oxide layer between the HSG polysilicon 58 and the seed layer 50, and therefore no need for additional harmful heat cycles, nor does the TiN layer 50 require doping for conductivity. Despite the naturally high conductivity of TiN, it is a stable material which will not contaminate processing furnaces, unlike many highly conductive metals.

Another important feature of the present invention is the fact that the HSG polysilicon layer 58, once formed, may then be heavily doped for conductivity. Former problems of dopant diffusion and contamination of the active area 37 are less of a concern because the TiN layer 50 forms an effective diffusion barrier to implanted dopants, as is well known in this art and as described by Stanley Wolf, "Silicon Processing for the VSLI Era: Volume 2—Process Integration," p.128. TiN is even a barrier to Even oxygen-assisted phosphorus diffusion (from solid source $P_2O_5$). Since solid source doping is less costly and more effective in three dimensional structures than implanted dopants, the preferred embodiment includes a step of doping the HSG polysilicon layer 58 with phosphorus in an oxygen assisted diffusion process, most preferably from solid source $P_2O_5$.

As a better diffusion barrier than polysilicon, the TiN layer 50 may also be deposited thinner than prior art silicon layers. This increases available volume within the memory cell and allows space for more complicated structures for the capacitor. Thus, the effective area of the plates can be increased both by adding additional folds to the capacitor structure, such as the folds introduced by stacked container capacitors, and by roughening the surface of the plates.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

What is claimed is:

1. A method of forming a plate of a capacitor in an integrated circuit, the method comprising the steps of:

etching a contact window through an insulating layer of the integrated circuit;

depositing a conductive nitride layer over the insulating layer and into the contact window, the conductive nitride layer electrically contacting an active area of an underlying substrate; and forming a hemispherical grained silicon layer over and directly contacting the conductive nitride layer.

2. The method of claim 1, wherein the conductive nitride layer comprises a refractory metal nitride layer.

3. The method of claim 2, wherein the refractory metal nitride layer comprises a titanium nitride layer.

4. The method of claim 3, wherein the titanium nitride layer is deposited to a thickness range of between about 50 Å and 500 Å.

5. The method of claim 4, wherein the titanium nitride depositing step comprises a chemical vapor deposition.

6. The method of claim 5, wherein the chemical vapor deposition comprises a metal organic chemical vapor deposition.

7. The method of claim 6, wherein the metal organic chemical vapor deposition comprises decomposing a tetrakisdimethylamidotitanium organic precursor.

8. The method of claim 7, wherein the metal organic chemical vapor deposition comprises depositing the titanium nitride at a temperature range between about 300° C. and 500° C., and a pressure range between about 0.1 and 2.0 Torr.

9. The method of claim 8, wherein the titanium nitride layer directly contacts the active area.

10. The method of claim 1, further comprising the step of heavily doping the hemispherical grained silicon layer with an electrically activating dopant, and wherein the conductive nitride layer forms a diffusion barrier to the dopants.

11. The method of claim 10, wherein the dopant comprises a phosphorous dopant is derived from a solid source under oxygen assisted diffusion.

12. The method of claim 11, wherein the solid source comprises $P_2O_5$.

13. The method of claim 1, wherein the hemispherical grained silicon growth step comprises a chemical vapor deposition.

14. The method of claim 13, wherein the chemical vapor deposition comprises a low pressure chemical deposition.

15. The method of claim 14, wherein the low pressure chemical vapor deposition comprises a decomposition of $SiH_4$ at a temperature range between about 540° C. and 560° C., and a pressure range between about 10 mTorr and 300 mTorr.

* * * * *

UNITED STATES PATENT AND TRADEMARK OFFICE
CERTIFICATE OF CORRECTION

PATENT NO. : 6,440,795 B1
DATED : August 27, 2002
INVENTOR(S) : Harshfield

It is certified that error appears in the above-identified patent and that said Letters Patent is hereby corrected as shown below:

<u>Column 2,</u>
Line 29, please replace "decants" with -- dopants --.

Signed and Sealed this

Fifteenth Day of July, 2003

JAMES E. ROGAN
*Director of the United States Patent and Trademark Office*